(12) United States Patent
Shafer

(10) Patent No.: US 6,737,935 B1
(45) Date of Patent: May 18, 2004

(54) DIPLEX CIRCUIT FORMING BANDSTOP FILTER

(75) Inventor: Steven Shafer, Chittenango, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 5 days.

(21) Appl. No.: 10/309,376

(22) Filed: Dec. 3, 2002

(51) Int. Cl.$^7$ .............................. H03H 7/01; H04N 7/10
(52) U.S. Cl. ....................... 333/132; 333/176; 333/167; 725/128
(58) Field of Search ................. 333/132, 167, 333/175, 176, 185; 725/128

(56) References Cited

U.S. PATENT DOCUMENTS

| | | | |
|---|---|---|---|
| 2,462,491 A | 2/1949 | Hallett | 361/816 |
| 3,579,154 A | 5/1971 | Deen | 333/176 |
| 3,806,813 A | 4/1974 | Eller | 725/128 |
| 3,956,717 A | 5/1976 | Fisher et al. | 333/121 |
| 4,100,516 A | 7/1978 | Hall | 333/134 |
| 4,701,726 A | 10/1987 | Holdsworth | 333/185 |
| 4,783,639 A | 11/1988 | Hudspeth et al. | 333/126 |
| 4,954,790 A | 9/1990 | Barber | 332/164 |
| 4,963,966 A | 10/1990 | Harney et al. | 725/149 |
| 5,150,087 A | 9/1992 | Yoshie et al. | 333/185 |
| 5,278,525 A | 1/1994 | Palinkas | 333/175 |
| 5,304,967 A | 4/1994 | Hayashi | 333/206 |
| 5,548,255 A | 8/1996 | Spielman | 333/132 |
| 5,745,838 A | 4/1998 | Tresness et al. | 725/128 |
| 5,793,265 A | 8/1998 | Spielman | 333/132 |
| 5,815,052 A | 9/1998 | Nakajima et al. | 333/175 |
| 5,821,831 A | * 10/1998 | Marland | 333/132 |
| 5,881,362 A | * 3/1999 | Eldering et al. | 725/125 |
| 5,898,406 A | 4/1999 | Matero | 343/702 |
| 5,906,512 A | 5/1999 | Reynolds | 439/579 |
| 5,999,796 A | 12/1999 | Tresness et al. | 725/125 |
| 6,031,432 A | 2/2000 | Schreuders | 333/24 R |
| 6,177,849 B1 | 1/2001 | Barsellotti et al. | 333/177 |
| 6,191,666 B1 | 2/2001 | Sheen | 333/185 |
| 6,252,474 B1 | * 6/2001 | Mizutani | 333/139 |

* cited by examiner

Primary Examiner—Barbara Summons
(74) Attorney, Agent, or Firm—Christopher R. Pastel; Hancock & Estabrook, LLP

(57) ABSTRACT

A bandstop filter for use in CATV applications is formed by a pair of diplexers, a lowpass filter and a highpass filter. Signals having a frequency range of, e.g., 0–3 GHz enter at a first node connected to the inputs of both the lowpass and highpass filters. Signals having frequencies below a first, predetermined value pass through the lowpass filter, and signals having frequencies above a second, predetermined value pass through the highpass filter with signals having frequencies between the first and second values being blocked, i.e., "stopped." The outputs of both the lowpass and highpass filters are connected to the second diplexer at a second node which is connected to the single output.

22 Claims, 8 Drawing Sheets

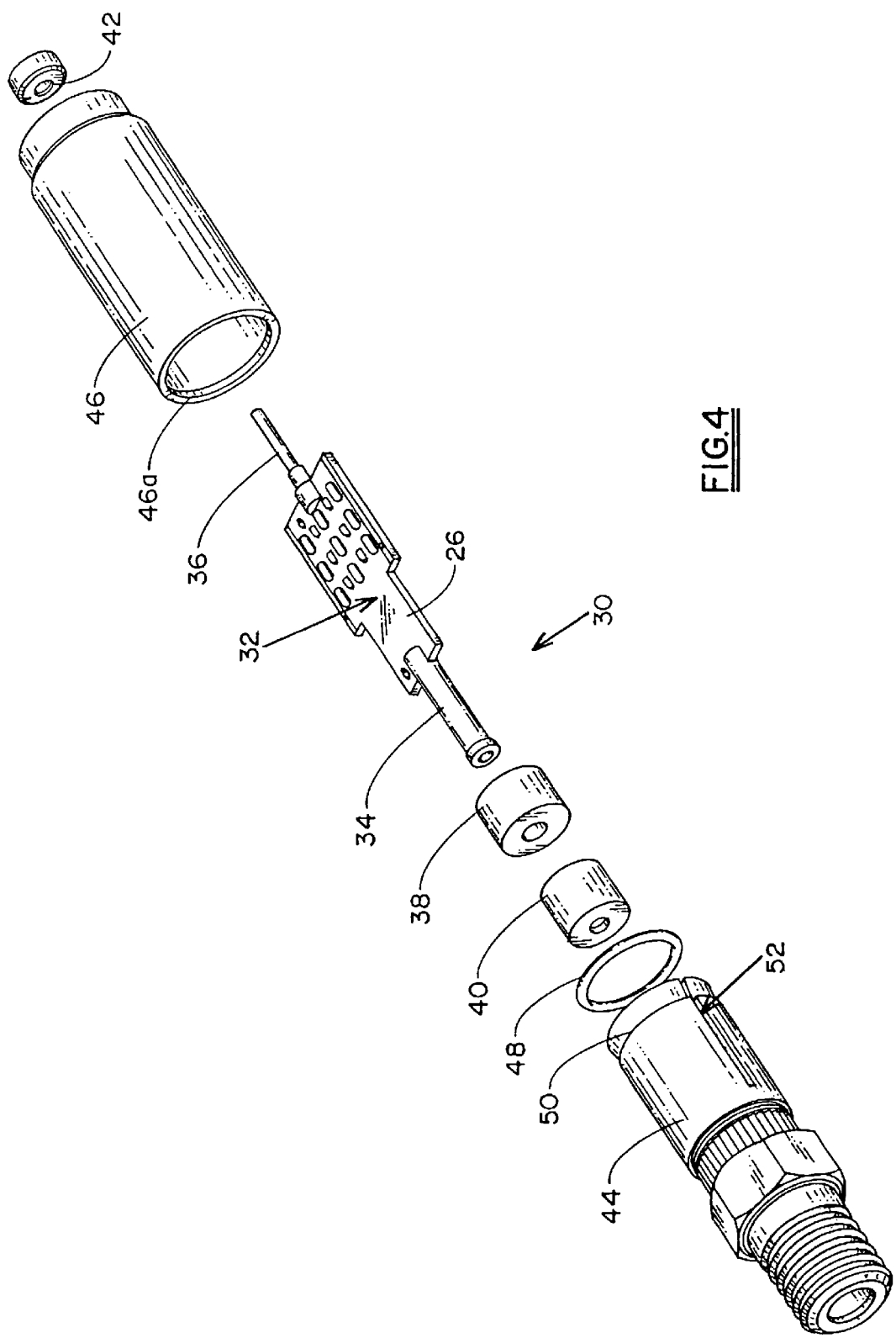

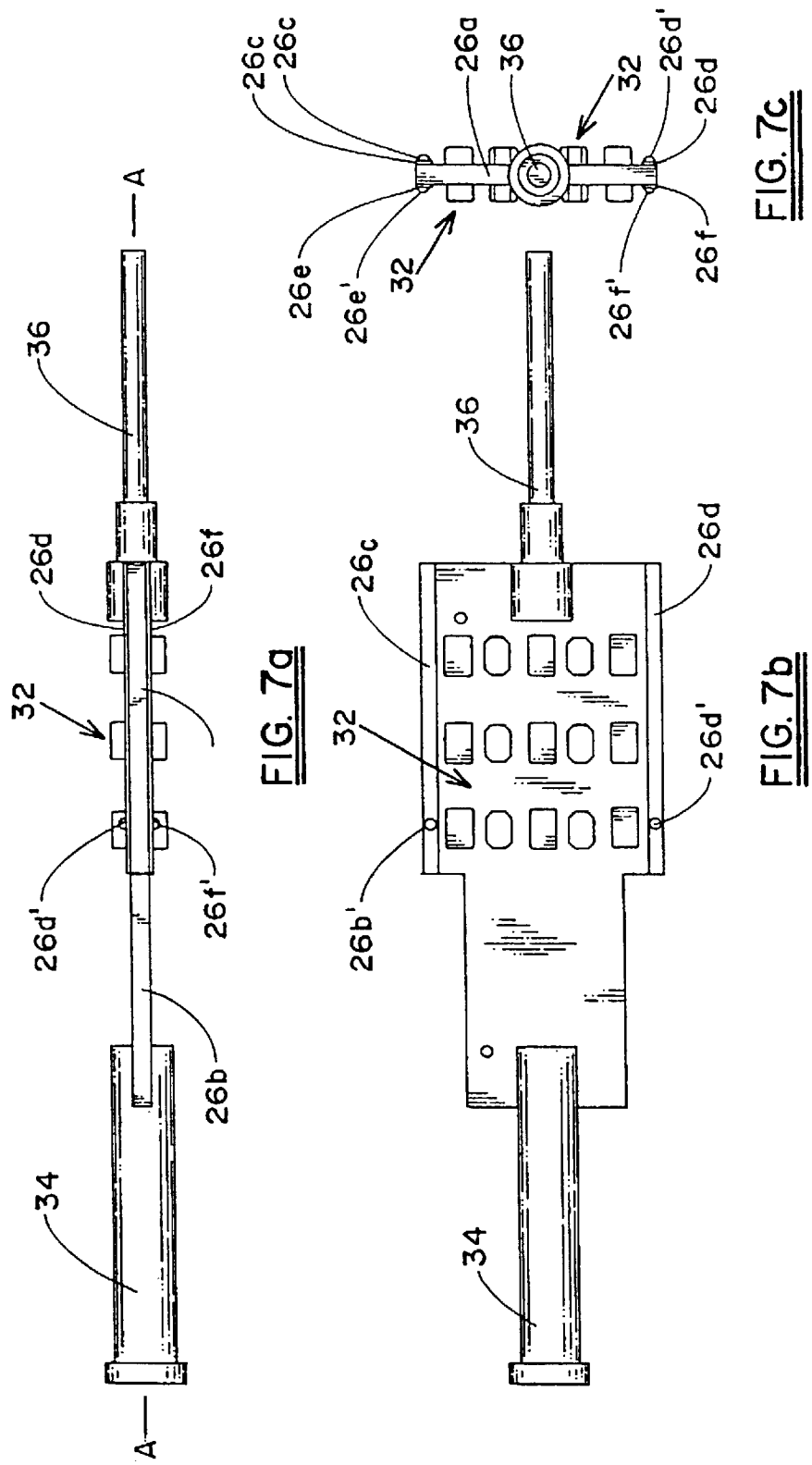

US 6,737,935 B1

DIPLEX CIRCUIT FORMING BANDSTOP FILTER

BACKGROUND OF THE INVENTION

The present invention relates to filter circuits of the type used in cable television (CATV) applications, and more specifically to bandstop filters.

A diplex circuit, or more simply a "diplexer," is a device which separates or combines RF signals. It has been found expedient to utilize diplexers in connection with CATV equipment in a number of situations, some of which use two diplexers back-to-back. These include step attenuators, power bypass circuits, cable simulators and equalizer circuits. Many of the prior art CATV diplex circuits are used to act on signals traveling in so-called forward and return paths, e.g., relatively high frequency RF signals pass from a source of such signals to a television set at subscriber premises in the forward direction over one leg of the circuit while lower frequency (DC) signals pass from the premises in the return direction.

Bandstop or "notch" filters are commonly employed in the CATV industry to block transmission of signals in a specified frequency range. For example, certain channels may be designated as premium channels, requiring payment of a fee from the subscriber in order to receive the signals carrying information representing such channels. If the service is not ordered, i.e., the fee is not paid, an appropriate filter is installed in the cable line coming into the non-paying premises. This is but one of the more traditional uses of bandstop filters, i.e., as a so-called trap. A more recent example is the aforementioned use in the handling of forward and return path signals between a headend and subscriber facilities.

It is desirable that bandstop filters be as compact as possible commensurate with quality performance of their intended function. It is also desirable, of course, that the filters be as inexpensive as possible, again while maintaining high performance criteria. Passband insertion and return loss is of critical importance in such filters, particularly in the digital signal market, which is steadily growing in significance.

It is an object of the present invention to provide a bandstop filter of smaller size than prior art filters offering the same level of performance.

Another object is to provide a bandstop filter for CATV applications which requires a smaller number of components than prior art filters of comparable capabilities.

A further object is to provide a bandstop filter with improved passband insertion and return loss.

It is a principal object to provide a bandstop filter for the CATV industry which incorporates all of the above advantages, i.e., achieving economics of both size and cost while still realizing improved performance.

Other objects will in part be obvious and will in part appear hereinafter.

SUMMARY OF THE INVENTION

In accordance with the foregoing objectives, the bandstop filter of the invention two diplexers, back-to-back, in series. A single input line carries signals in a frequency range of , e.g., 0–3 GHz, to a node connected to each of a highpass and a lowpass filter, in parallel. Only signals having a frequency above a first, predetermined value pass through the highpass filter, and only signals having a frequency below a second, predetermined value pass through the lowpass filter. The first and second values are chosen so that a predetermined range of frequencies, i.e., the range or band of frequencies below the first and above the second value, is "stopped" from passing to the single output line. Thus, the RF signals are divided by the first diplexer between those at frequencies which pass the highpass and those which pass the lowpass filters. The outputs of the high and lowpass filters are connected at a second node to form a second diplexer having an output including only signals having frequency values which pass the high and lowpass filters. Frequencies between those passed by the high and lowpass filters do not appear at the output, thereby providing the bandstop. The diplexers are frequency selective, resulting in lower insertion loss due to frequency isolation of the two output ports.

By implementing this circuitry with surface mount technology the bandstop filter of the invention requires fewer components than conventional filters of the same type and level of performance. This means, of course, that the filter of the invention may be fabricated in smaller size and at lower cost than comparable prior art filters. In the preferred embodiment, the components are of the surface mount type with the components forming the highpass and lowpass filters mounted on opposite sides of a single printed circuit board. The circuit also exhibits improved passband insertion and return loss, which is a particularly important feature in the digital signal market.

The foregoing and other features of construction and operation of the bandstop filter of the invention will be more readily understood and fully appreciated from the following detailed disclosure, taken in conjunction with the accompanying drawings.

BRIEF DESCRIPTION OF THE DRAWINGS

FIG. 4 is an exploded perspective view of a filter assembly incorporating the printed circuit board of FIGS. 3a and 3b;

FIGS. 7a, 7b and 7c are side elevational, top plan, and end elevational views, respectively, providing an orthogonal projection of the circuit board and connectors.

DETAILED DESCRIPTION

Figure 1:
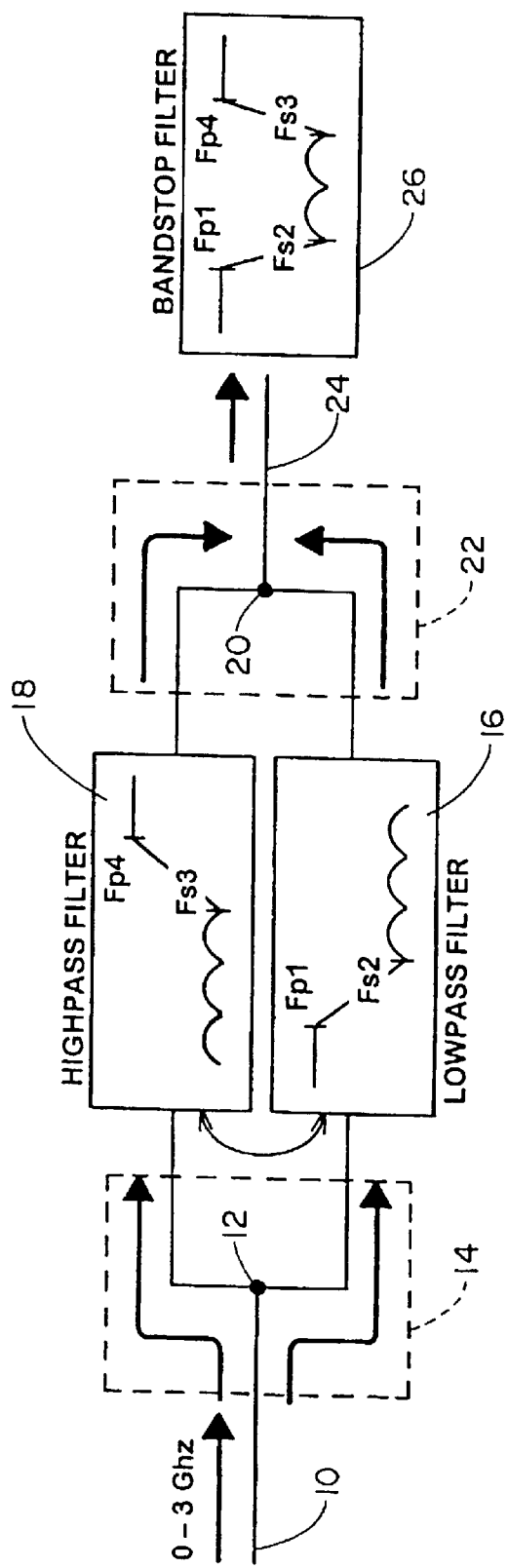
FIG. 1 is an illustrative flow or block diagram of the circuit of the invention.

Referring now to FIG. 1 of the drawings, input line 10 carries signals which may range in frequency from 0 to 3 GHZ. All signals enter node 12 of first diplexer 14 where they are divided between an upper leg of the circuit, formed by lowpass filter 16, and a lower leg, formed by highpass filter 18. Filters 16 and 18 are each composed of a plurality of components (inductors and capacitors) connected in electrically operative relation, preferably in a plurality of stages or sections each containing an inductor and a capacitor to establish a resonant circuit, as will appear later. By proper selection of the values of components connected in a particular configuration, signals having a frequency value above a first predetermined level will pass through highpass filter 18. This frequency above which signals are passed by filter 18 is indicated in the drawing as Fp4. Likewise, signals having a frequency value below a second, predetermined level will pass through lowpass filter 16. This frequency below which signals are passed by filter 16 is indicated as Fp1. Signals having a frequency above Fs2 (equal to or slightly greater than Fp1) are stopped or blocked, as are signals having a frequency below Fs3 (equal to or slightly less than Fp4). Signals passing through filters 16 and 18 are combined at node 20 of second diplexer 22 and are carried by output line 24. The graphical representations in FIG. 1 indicate generally the energy levels of signals at the indicated frequencies. As is apparent, essentially all signals having frequencies below Fp1 and above Fp4 will be passed to the output, while those between Fs2 and Fs3 will reflectively be blocked, thereby providing bandstop filter 26. It will be understood, of course, that representation of bandstop filter 26 in FIG. 1 does not imply the existence of another filter circuit in output line 24, but simply illustrates the fact that signals having frequencies below Fp1 and above Fp4 appear on the output line with signals in the frequency band between Fp1 and Fp4 are stopped.

Figure 2:
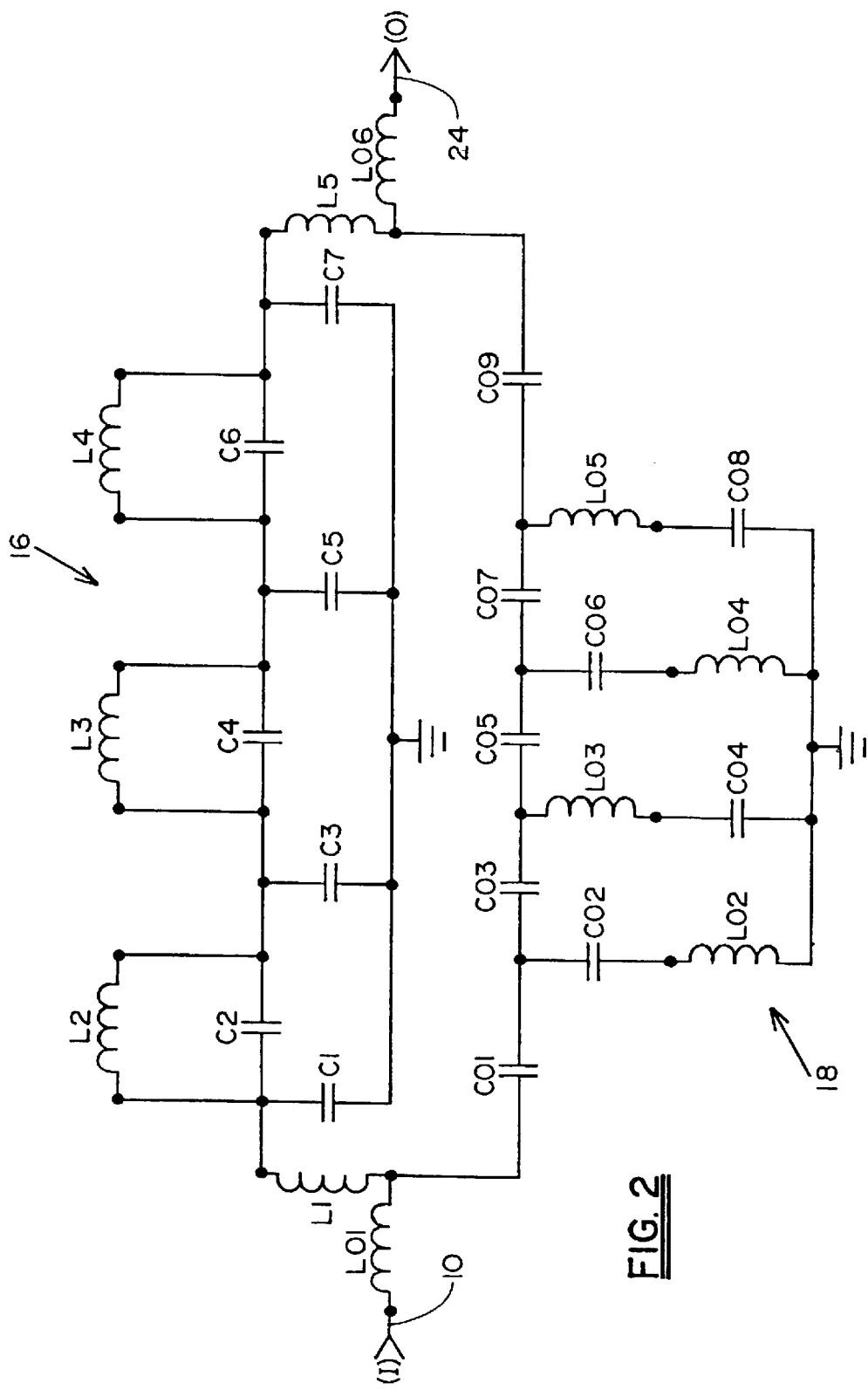
FIG. 2 is an electrical schematic of a circuit providing the features of the diagram of FIG. 1.

A preferred form of circuit which embodies the invention is shown in schematic form in FIG. 2. Signals on input line 10 pass through inductor L01. Lowpass filter 16 and highpass filter 18 are shown as forming the upper and lower legs, respectively, of the circuit. Lowpass filter 16 consists of inductors L1 through L5 and capacitors C1 through C7. Highpass filter 18 consists of inductors L02 through L05 and capacitors C01 through C09. Signals which pass through one or the other of filters 14 and 16 pass through inductor L06 to output line 24.

Figures 3A, 3B:
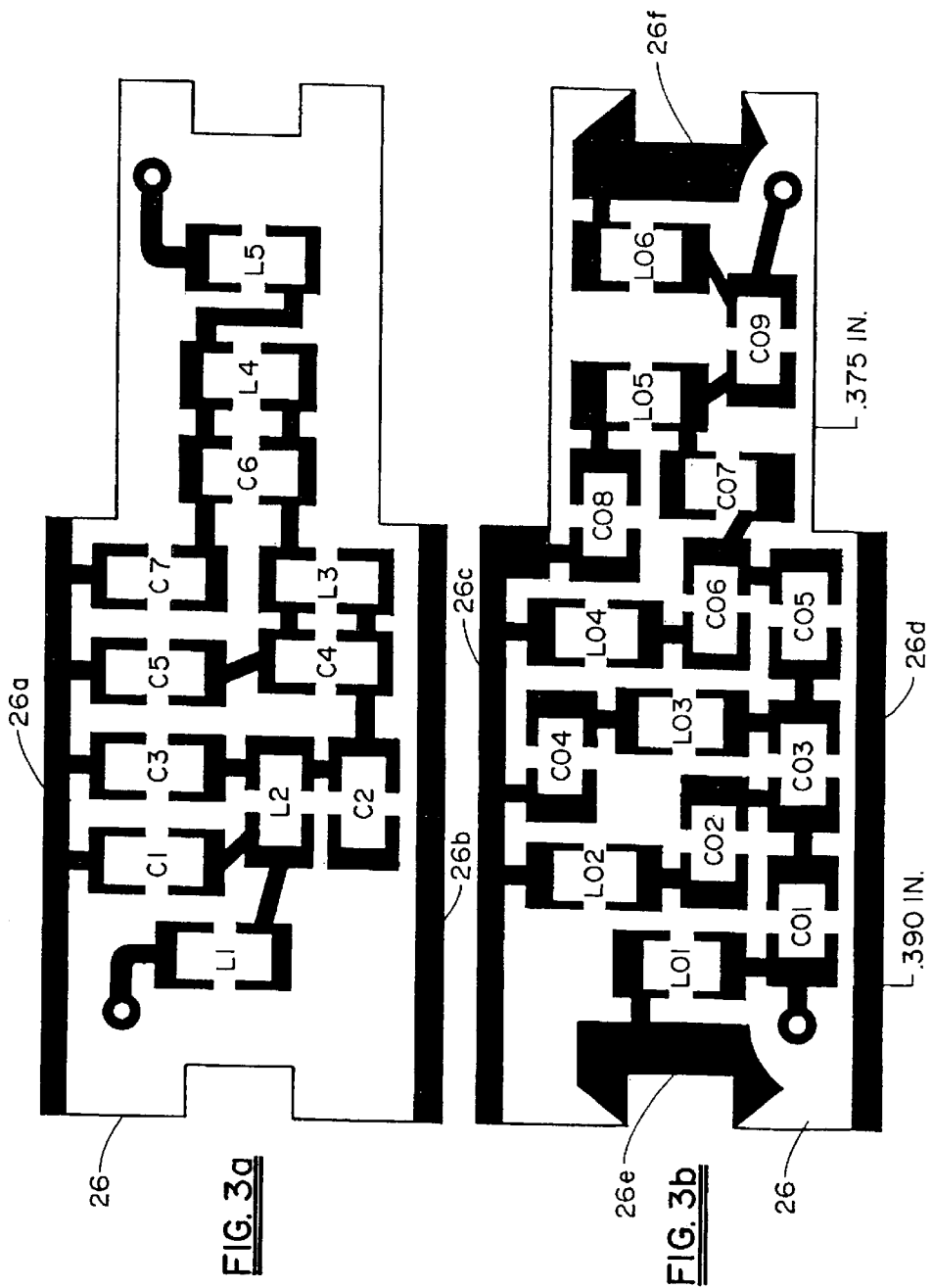
FIGS. 3a and 3b are top and bottom plan views of a printed circuit board with components forming the circuit of FIG. 2 mounted thereon by surface mount techniques.

A physical layout of the components forming bandstop filter 22 on top and bottom surfaces of circuit board 26 is shown in FIGS. 3a and 3b, respectively. The components forming lowpass circuit 16, namely, inductors L1–L5 and capacitors C1–C7, are shown in FIG. 3a, together with grounding buses 26a and 26b and the electrical paths or traces on circuit board 26 connecting the components to one another and to grounding bus 26a. Shown in FIG. 3b are the components forming highpass circuit 18, namely, inductors L02–L05 and capacitors C01–C09, together with grounding buses 26c and 26d, input and output inductors L01 and L06, respectively, and conducting pads 26e and 26f for connection to the circuit of the usual male and female connectors (not shown).

Lowpass filter 16 consists of three sections, the first formed by inductor L2 and capacitor C2, the second by inductor L3 and capacitor C4 and the third by inductor L4 and capacitor C6. These sections are connected to grounding bus 26a by electrical paths P1, P2, P3 and P4 through parallel capacitors C1, C3, C5 and C7, respectively. Highpass filter 18 consists of four sections, the first formed by capacitor C02 and inductor L02, the second by inductor L03 and capacitor C04, the third by capacitor C06 and inductor L04 and the forth by inductor L05 and capacitor C08. The sections are in parallel, separated from each other and from the input and output by capacitors C01, C03, C05, C07 and C09, each section including a component connected directly to grounding bus 26c through paths P01, P02, P03 and P04. Grounding buses 26a and 26c are at ground potential, preferably by direct communication with a housing (not shown) wherein circuit board 26 and the circuit components thereof are mounted. Details of such a housing and the manner of grounding connection thereto of grounding buses 26a and 26c, as well as a discussion of the preferred presence of grounding buses 26b and 26d in spite of their non-functionality in the electrical circuit, may be found in companion application Ser. No. 10/309,375, filed of even date herewith and incorporated by reference herein. As further explained in detail in the companion application, performance of the circuit, particularly at frequencies above about 300 MHz, is markedly improved by the short electrical paths from each stage of each filter to ground, as well as by the firm and reliable electrical communication of grounding strips 26a and 26c along substantially their entire lengths.

In FIG. 4 is shown an embodiment of a complete filter assembly, denoted generally by reference numeral 30, incorporating circuit 22 on board 26. Assembly 30 includes a filter circuit having a plurality of components (inductors, capacitors, etc.), collectively indicated by numeral 32. Circuit components 32 are mounted by conventional surface mount techniques upon printed circuit board 26. Female connector assembly 34 and male connector 36 are each attached at one end to board 26 in electrical communication with the circuit formed by components 32. Both the structure and manner of connection of the male and female connectors to the circuit board are entirely conventional. Female connector assembly 34 extends, with force fit, through openings in deformable rubber seal 38 and insulator 40. Male connector 36 extends, with force fit, through an opening in insulator 42.

Figure 5:
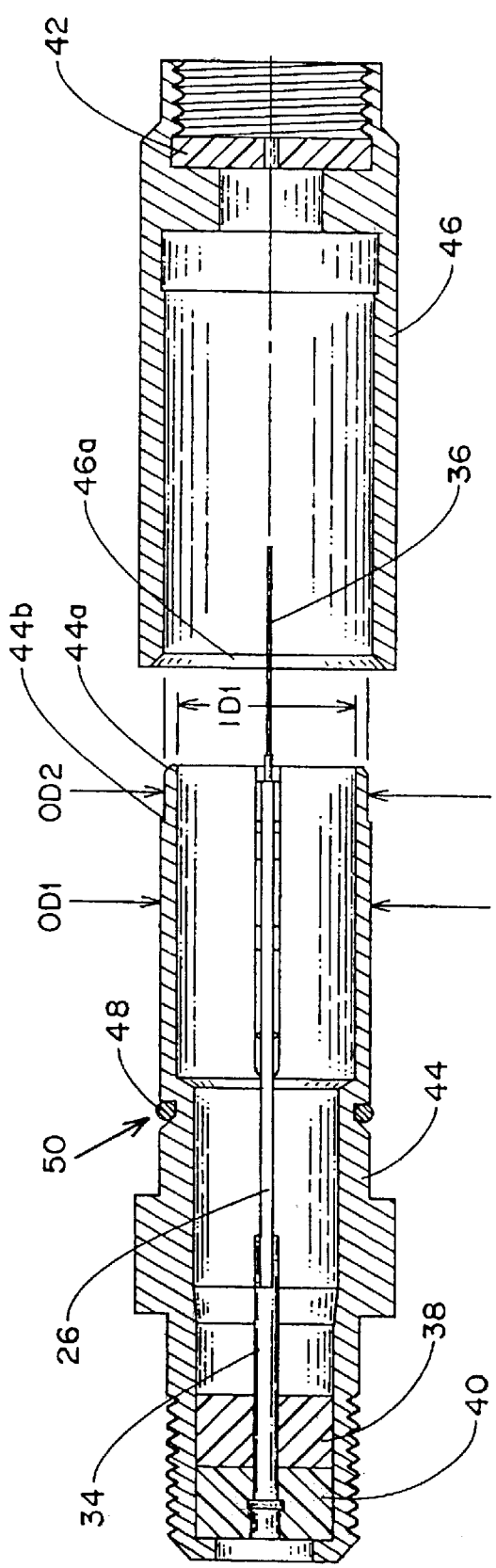
FIG. 5 is a side elevational view of the filter assembly of FIG. 4 in axial cross section in an intermediate stage of assembly.
Figure 6:
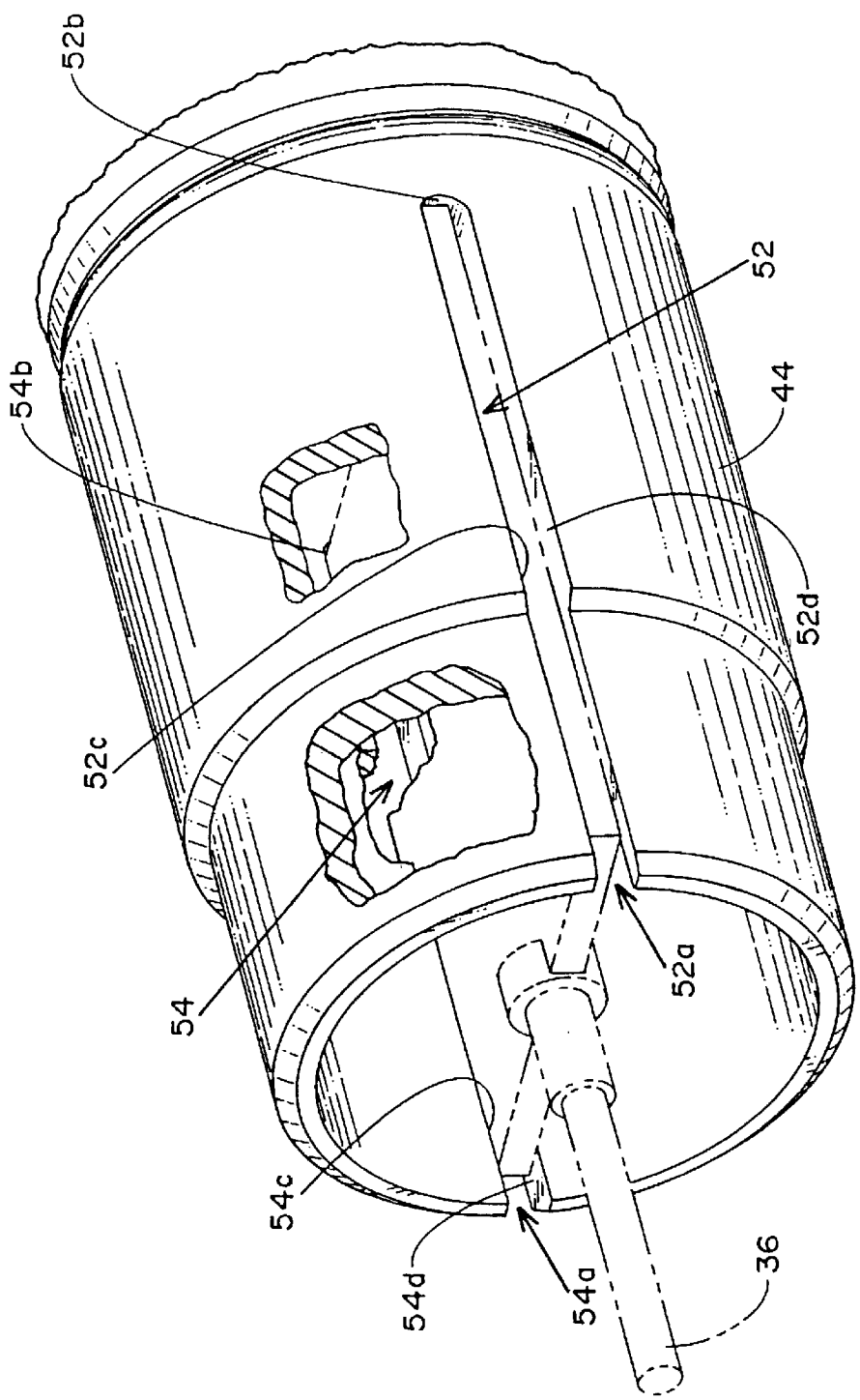
FIG. 6 is an enlarged, fragmentary, perspective view of the inner housing section of the assembly, with the circuit board and male connector shown in phantom lines.

The circuit board with attached connectors, together with insulators and seal are mounted within a housing formed by inner and outer portions 44 and 46, respectively, each being in the form of a hollow cylinder, preferably having a 0.820 inch diameter or less. O-ring 48 is received in groove 50 in inner portion 44 and serves as a moisture resistant seal between portions 44 and 46 when assembled. The elements are shown in FIG. 5 prior to the final assembly operation. In the preliminary operations, seal 38 and insulator 40 have been inserted into inner portion 44 and insulator 42 has been inserted within outer portion 46 in the positions indicated. Circuit board 26 has been inserted into inner portion 44 with female connector assembly 34 extending through the opening in seal 38 and into the opening in insulator 40. As best seen in FIG. 6, inner portion 44 includes a pair of open slots 52 and 54 extending from open ends 52a and 54a, respectively, at one end of inner portion 44 to closed ends 52b and 54b, respectively. Slot 52 has opposing, spaced edges 52c and 52d, and slot 54 has opposing, spaced edges 54c and 54d.

Circuit board 26 is shown in greater detail in the orthographic projection of FIGS. 7a–7c. In the illustrated embodiment, board 26 includes relatively wide and narrow, integral portions 26a and 26b, respectively, each having substantially parallel side edges spaced equally from central axis A—A. Strips of thin, copper foil 26c and 26d are securely adhered to what is termed the top surface (FIG. 7b) of board 26 in lateral edge portions bordering the side edges of portion 26a, and like strips 26e and 26f are secured to lateral edge portions of the bottom surface. As explained later in more detail, these strips are in electrical communication with the circuit formed by components 32 and serve as grounding buses for the circuit. Small raised portions, or "bumps" are provided on each of strips 26c, 26d, 26e and 26f. In the illustrated embodiment, one bump is provided on each of the strips, reference numerals 26c', 26d', 26e' and 26f' denoting the bumps on strips 26c, 26d, 26e and 26f, respectively. More than one bump may be provided on any or all strips, if desired, but it is preferred that at least one bump be provided on each strip near the end thereof at the juncture between portions 26a and 26b. The bumps are of conductive material, and may conveniently be deposited as small drops of solder.

When board 26 has been inserted into inner portion 44 the lateral edge portions of wider portion 26a are positioned in slots 52 and 54, and extend substantially the full length of the slots. As shown in FIG. 5, inner portion 44 has an outside diameter OD1 over the major portion of its length and a somewhat smaller diameter OD2 over a portion at the end at which the open ends of slots 52 and 54 are formed. The width of board portion 26a is slightly less than diameter OD2 but larger than the inside diameter ID1 of the part of portion 44 which includes slots 52 and 54. Bevel 44a is formed about the periphery of the end of portion 44 bordering OD2, and bevel 44b is formed about the periphery of the shoulder at the junction of the two outside diameters.

Figure 8A:
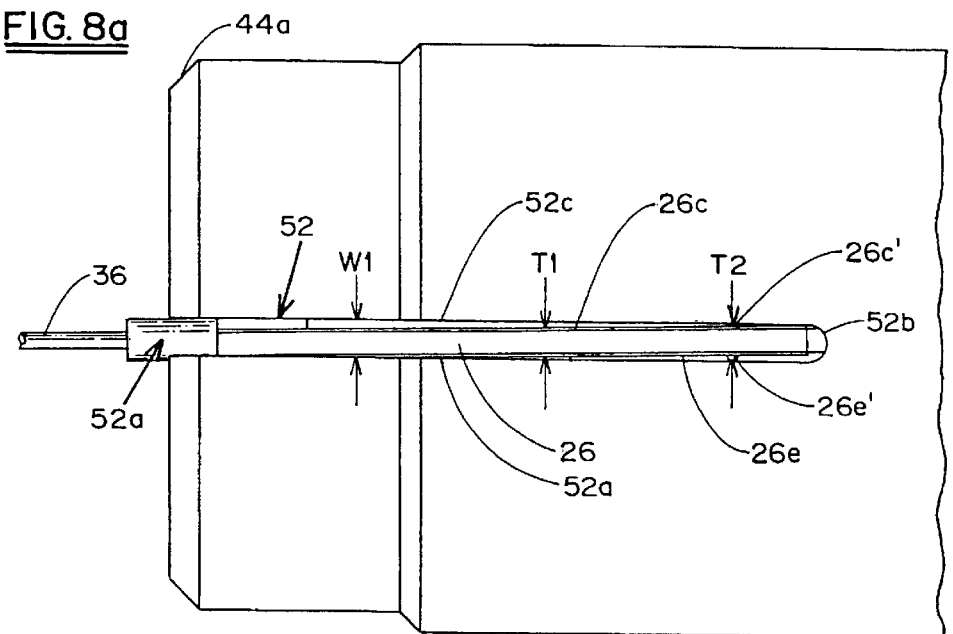
FIGS. 8a and 8b are fragmentary, elevational views, partly in section, of portions of the assembly in successive stages of assembly.
Figure 8B:
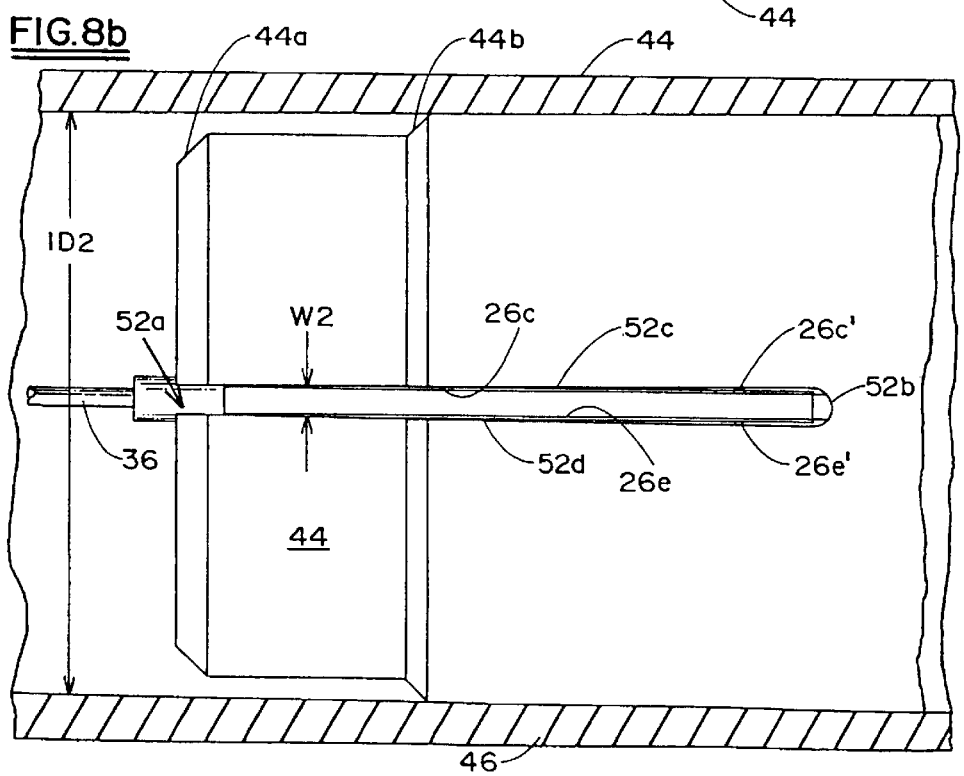

Referring now to FIGS. 8a and 8b, inner and outer portions 44 and 46, respectively, are shown in axially aligned relation, before and after the final assembly step of forcing the outer over the inner portion. The inside diameter ID2 of portion 46 is larger than OD2 but smaller than OD1 of portion 44. Bevel 46a (FIGS. 4 and 5) is formed about the periphery of the end of outer section 46 bordering ID2. Bevels 44a and 46a, together with the fact that OD2 is less than ID2 (by a few thousands of an inch) facilitate mating engagement of section 44 and 46 over the axial length of the part of inner portion 44 of diameter OD2. Bevels 44b and 46a facilitate axial alignment of portions 44 and 46 as they are forced into telescopically engaged relation. The difference in diameters OD1 and ID2 is preferably great enough to require the use of an arbor press, or other appropriate tool, to effect relative axial movement of the two sections into full engagement, as seen in FIG. 8b. This interference fit results in some degree of radially inward deformation of the slotted part of inner portion 44 in the fully assembled condition. Prior to assembly of the two portions, as shown in FIG. 8a, the spacing of opposing edges 52c and 52d, i.e., the width of slot 52, denoted by dimension W1 is greater than the thickness T1 of the portion of board 26 which is positioned between the slot edges, and is about the same as thickness T2 in the area of bumps 26c' and 26e'. The same is true, of course, with respect to slot 54.

After assembly, as seen in FIG. 8b, the interference fit with outer portion 46 has caused slot 52 to narrow, i.e. opposing edges 52c and 52d are closer together and engage the surfaces of strips 26c and 26e. The amount of inward movement of the slot edges is greatest, of course, at the open end of the slot. The width near the open ends of the slots is indicated in FIG. 8b by dimension W2 (<W1). Although the amount of inward movement of slot edges 52c and 52d is less as slot 52 approaches closed end 52b, it is nevertheless sufficient to cause the slot edges to engage bumps 26c' and 26e'. Thus, a very solid and reliable ground path along substantially the entire length of grounding buses 26c, 26d, 26e and 26f is provided by the assembly of FIGS. 4–8b. It will be noted that the electrical communication between the grounding buses and housing is established and maintained without any soldering operations during or after assembly of the parts. Circuit board 26 is narrower than the outside diameter of the inner portion to avoid. possibly damaging compression by interference fit of the board with the inside diameter of the outer portion. The circuit board is captured with a high pressure contact from the copper ground bus to the inner housing portion along a sufficient length on each side of the circuit components to ensure adequate isolation from inductance and resistance parasitics for proper circuit operation, particularly at frequencies above about 300 Mhz. The compressive engagement of O-ring 48 between portions 44 and 46 effectively prevents ingress of moisture or foreign matter in the housing.

From the foregoing it will be appreciated that the bandstop filter of the present invention provides a number of advantages over conventional bandstop filters, among which are improved insertion and return loss. Since the high and low frequency signals are divided and pass, respectively, through highpass and lowpass filters before being recombined, the filter is of the frequency-selective type, thereby reducing the losses. Furthermore, the bandstop filter is implemented in an embodiment using fewer components than the conventional bandstop filter. Also, by using surface mount components with the highpass and lowpass filter components mounted on opposite sides of a single circuit board, the bandstop filter is embodied in an extremely compact physical package. A fully operational bandstop filter of the present invention may be realized by mounting commercially available inductors and capacitors in the configuration shown in FIGS. 3a and 3b on a circuit board having an area of about 250 square millimeters on each surface, although it will be understood that design options using both larger and smaller boards are possible within the scope of the invention. Consequently, a housing or casing wherein the board and components mounted thereon are contained may be designed in extremely small versions and in a variety of configurations, such as that of FIGS. 4–8b and others described in previously mentioned companion application Ser. No. 10/309,375.

What is claimed is:

1. A bandstop filter for CATV applications having an input for receiving signals having frequencies in a predetermined range and an output carrying signals having frequencies below a first value within said range and above a second value, higher than said first value, within said range with signals having frequencies between said first and second values being blocked from reaching said output, said filter comprising:

a) a first diplexer to which said input is connected at a first node;

b) a lowpass filter having a first input end connected to said first node and a first output end, said lowpass filter having components between said first input and output ends which pass signals having frequencies below said first value and block signals having frequencies above said first value;

c) a highpass filter having a second input end connected to said first node and a second output end, said highpass filter having components between said second input and output ends which pass signals having frequencies above said second value and block signals having frequencies below said second value; and d) a second diplexer having a second node to which said first output end of said lowpass filter, said second output end of said highpass filter and said output are all connected.

2. The bandstop filter of claim 1 wherein said components of each of said lowpass and highpass filters comprise a plurality of inductors and capacitors.

3. The bandstop filter of claim 2 wherein said components are all of the surface mount type and are mounted on a single printed circuit board.

4. The bandstop filter of claim 3 wherein said circuit board has opposite, major surfaces and said components of said lowpass filter are mounted upon one surface and said components of said highpass filter are mounted upon the opposite surface of said printed circuit board.

5. The bandstop filter of claim 3 and further including a housing and means for mounting said circuit board within said housing.

6. The bandstop filter of claim 5 and further including a secure grounding connection between said components and said housing.

7. The bandstop filter of claim 6 wherein said housing has a diameter of no greater than 0.820 inches.

8. The bandstop filter of claim 6 wherein said grounding connection comprises at least one elongated grounding bus on said circuit board which is in electrical communication with said housing over substantially the full length of said grounding bus.

9. The bandstop filter of claim 5 wherein said housing includes two portions which are mutually joined by a force fit of one of said portions into the other.

10. The bandstop filter of claim 9 wherein said two portions form a hollow, substantially cylindrical structure.

11. The bandstop filter of claim 10 wherein said force fit compresses one of said two portions into electrical communication with each of said lowpass and highpass filters.

12. The bandstop filter of claim 11 wherein said circuit board has opposite, major surfaces, said components of said lowpass filter are mounted upon one surface and said components of said highpass filter are mounted upon the opposite surface of said printed circuit board, and further including a first grounding bus mounted upon said one surface and electrically communicating with said lowpass filter and with said housing, and a second grounding bus mounted upon said opposite surface and electrically communicating with said highpass filter and with said housing.

13. The bandstop filter of claim 11 wherein said circuit board includes first and second, parallel, elongated edges, and said first and second grounding buses extend along said first and second edges, respectively.

14. A bandstop filter for CATV applications comprising:
   a) a signal input terminal for receiving RF signals having frequencies in a predetermined range;
   b) first filter means for receiving signals from said input terminal and passing to a first filter output signals having frequencies below a first value within said predetermined range and blocking signals having frequencies above said first value;
   c) second filter means for receiving signals from said input terminal and passing to a second filter output signals having frequencies above a second value, higher than said first value, within said predetermined range and blocking signals having frequencies below said second value, whereby said RF signals from said input terminal are separated by said first and second filter means into different frequency bands; and
   d) a signal output terminal connected to both said first and second outputs, whereby said RF signals which pass said first and second filter means are combined at said output terminal.

15. The bandstop filter of claim 14 wherein said first filter means comprise a lowpass filter.

16. The bandstop filter of claim 15 wherein said second filter means comprise a highpass filter.

17. The bandstop filter of claim 16 wherein said first and second filter means each comprise a plurality of inductors and capacitors.

18. The bandstop filter of claim 17 wherein all of said inductors and capacitors are surface mounted upon a single printed circuit board.

19. The bandstop filter of claim 18 wherein said inductors and capacitors of said first filter means are mounted on one surface of said board and said inductors and capacitors of said second filter means are mounted on the opposite surface of said board.

20. The method of communicating RF signals having frequencies below a first value and above a second value while blocking signals having frequencies between said first and second values, said method comprising:
   a) connecting a first plurality of electronic components to form a first filter circuit having a first input and a first output, said first filter circuit being operative to pass RF signals applied to said first input which have frequencies below a first value and to block signals having frequencies above said first value;
   b) connecting a second plurality of electronic components to form a second filter circuit having a second input and a second output, said second filter circuit being operative to pass RF signals applied to said second input which have frequencies above a second value, higher than said first value, and to block signals having frequencies below said second value;
   c) connecting said first and second inputs and a single input line carrying RF signals together at a first node to form a first diplexer; and
   d) connecting said first and second outputs and a single output line together at a second node to form a second diplexer, whereby said first and second filter circuits are connected in parallel and said first and second diplexers are in series.

21. The method of claim 20 wherein said diplexers are frequency selective.

22. The method of claim 20 wherein said first and second pluralities of electronic components are surface mounted upon first and second, opposite surfaces, respectively, of a single printed circuit board.

* * * * *

INTER PARTES REEXAMINATION CERTIFICATE (549th)

United States Patent
Shafer

(10) Number: US 6,737,935 C1
(45) Certificate Issued: Mar. 5, 2013

(54) DIPLEX CIRCUIT FORMING BANDSTOP FILTER

(75) Inventor: Steven Shafer, Chittenango, NY (US)

(73) Assignee: John Mezzalingua Associates, Inc., East Syracuse, NY (US)

Reexamination Request:
No. 95/001,071, Jul. 23, 2008

Reexamination Certificate for:
Patent No.: 6,737,935
Issued: May 18, 2004
Appl. No.: 10/309,376
Filed: Dec. 3, 2002

(51) Int. Cl.
*H03H 7/01* (2006.01)
*H04N 7/10* (2006.01)

(52) U.S. Cl. ......... 333/132; 333/176; 333/167; 725/128
(58) Field of Classification Search .................. None
See application file for complete search history.

(56) References Cited

To view the complete listing of prior art documents cited during the proceeding for Reexamination Control Number 95/001,071, please refer to the USPTO's public Patent Application Information Retrieval (PAIR) system under the Display References tab.

*Primary Examiner* — My-Trang Nu Ton

(57) ABSTRACT

A bandstop filter for use in CATV applications is formed by a pair of diplexers, a lowpass filter and a highpass filter. Signals having a frequency range of, e.g., 0-3 GHz enter at a first node connected to the inputs of both the lowpass and highpass filters. Signals having frequencies below a first, predetermined value pass through the lowpass filter, and signals having frequencies above a second, predetermined value pass through the highpass filter with signals having frequencies between the first and second values being blocked, i.e., "stopped." The outputs of both the lowpass and highpass filters are connected to the second diplexer at a second node which is connected to the single output.

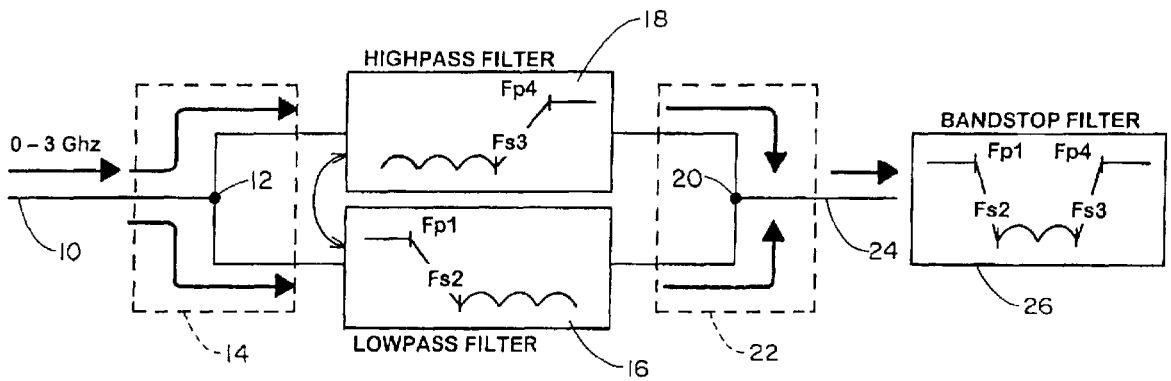

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-2, 14-17 and 20-21 are cancelled.
Claims 3-13, 18-19 and 22 were not reexamined.

\* \* \* \* \*